United States Patent
Krueger et al.

(10) Patent No.: US 9,374,923 B2
(45) Date of Patent: Jun. 21, 2016

(54) MONOLITHIC LTCC SEAL FRAME AND LID

(71) Applicants: Honeywell Federal Manufacturing & Technologies, LLC, Kansas City, MO (US); Sandia Corporation, Albuquerque, NM (US)

(72) Inventors: Daniel S. Krueger, Liberty, MO (US); Kenneth A. Peterson, Albuquerque, NM (US); Dave Stockdale, Lee's Summit, MO (US); James Brent Duncan, Pleasant Hill, MO (US); Bristen Riggs, Belton, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 106 days.

(21) Appl. No.: 14/091,578

(22) Filed: Nov. 27, 2013

(65) Prior Publication Data
US 2015/0145385 A1 May 28, 2015

(51) Int. Cl.
*H01L 21/50* (2006.01)
*H01L 21/48* (2006.01)
*H05K 5/06* (2006.01)
*H05K 5/03* (2006.01)
*H05K 5/00* (2006.01)
*H05K 13/00* (2006.01)

(52) U.S. Cl.
CPC .............. *H05K 5/069* (2013.01); *H05K 5/0004* (2013.01); *H05K 5/03* (2013.01); *H05K 13/0015* (2013.01)

(58) Field of Classification Search
CPC ........ H05K 5/069; H05K 5/03; H05K 5/0004
USPC .......................................................... 438/125
See application file for complete search history.

(56) References Cited

U.S. PATENT DOCUMENTS 7,648,775 B2 * 1/2010 Wakako et al. ............... 428/636
8,531,018 B2 * 9/2013 Pahl .............................. 257/678

* cited by examiner

*Primary Examiner* — Luan C Thai
(74) *Attorney, Agent, or Firm* — Hovey Williams LLP

(57) ABSTRACT

A method for forming a monolithic seal frame and lid for use with a substrate and electronic circuitry comprises the steps of forming a mandrel from a ceramic and glass based material, forming a seal frame and lid block from a ceramic and glass based material, creating a seal frame and lid by forming a compartment and a plurality of sidewalls in the seal frame and lid block, placing the seal frame and lid on the mandrel such that the mandrel fits within the compartment, and cofiring the seal frame and lid block.

20 Claims, 5 Drawing Sheets

MONOLITHIC LTCC SEAL FRAME AND LID

GOVERNMENT LICENSE RIGHTS UNDER FEDERALLY SPONSORED RESEARCH AND DEVELOPMENT

This invention was developed with government support under Contract DE-NA0000622 with Honeywell Federal Manufacturing & Technologies, LLC and the U.S. Department of Energy, and under Contract DE-AC04-94AL85000 between Sandia Corporation and the U.S. Department of Energy. The U.S. Government has certain rights in this invention.

BACKGROUND OF THE INVENTION

1. Field of the Invention

Embodiments of the present invention relate to low temperature cofired ceramic microelectronic packaging.

2. Description of the Related Art

A microelectronic package may be formed from a low-temperature cofired ceramic (LTCC) circuit substrate, electronic circuitry, a seal frame, and a lid. The LTCC circuit substrate may be formed from a stack of ceramic material sheets, often with passive components and interconnects included between the sheets. The electronic circuitry may include integrated circuits and similar components that are placed on the top surface or in cavities of the LTCC substrate. The seal frame includes a plurality of sidewalls placed on the top surface that surrounds the electronic circuitry. The lid is placed on the seal frame such that the sidewalls contact the perimeter of the lid. In some instances, the seal frame and the lid may be a single unit.

Traditionally, the seal frame and lid may have been constructed from metals or metal alloys, such as Kovar®, which are selected because their coefficient of thermal expansion (CTE) is close to that of the LTCC substrate. However, as the size of the microelectronic package increases, even a small mismatch in the CTE can pose a problem for long term reliability. During normal operation of the microelectronic package and its usage in harsh environments, the package may experience wide swings in temperature. With a CTE mismatch between the LTCC substrate and the seal frame, these temperature swings can lead to degradation or failure of the attachment of the seal frame to the LTCC substrate. Ideally, the seal frame and lid would be constructed from the same ceramic material as the LTCC substrate. But, previous attempts to form a ceramic seal frame and lid have been labor intensive and have suffered from difficulties relating to layer-to-layer alignment, lamination, and dimensional control during the cofiring process.

SUMMARY OF THE INVENTION

Embodiments of the current invention solve the above-mentioned problems and provide a distinct advance in the art of low temperature cofired ceramic microelectronic packaging. More particularly, embodiments of the invention provide a method for forming a monolithic seal frame and lid that utilizes a mandrel constructed from ceramic material.

A first embodiment of the current invention provides a method for forming a monolithic seal frame and lid for use with a substrate and electronic circuitry. The method comprises the steps of: forming a mandrel from a ceramic and glass based material, forming a seal frame and lid block from a ceramic and glass based material, creating a seal frame and lid by forming a compartment and a plurality of sidewalls in the seal frame and lid block, placing the seal frame and lid on the mandrel such that the mandrel fits within the compartment, and cofiring the seal frame and lid block.

A second embodiment of the current invention provides a method for forming a monolithic seal frame and lid for use with a substrate and electronic circuitry. The method comprises the steps of: forming a mandrel from a ceramic and glass based material wherein the mandrel has roughly the same shape as the electronic circuitry with roughly the same length and width as the electronic circuitry and a greater height than the electronic circuitry, coating at least a portion of the upper surface of the mandrel with a high-temperature lubricant, forming a seal frame and lid block from a ceramic and glass based material, forming a seal frame and lid by routing ceramic and glass based material from the seal frame and lid block to create a compartment and a plurality of sidewalls, placing the seal frame and lid on the mandrel such that the mandrel fits within the compartment, cofiring the seal frame and lid, and coating at least a portion of the seal frame and lid with a layer of metal.

A third embodiment of the current invention provides a method for forming a monolithic seal frame and lid for use with a substrate and electronic circuitry. The method comprises the steps of: forming a plurality of mandrels from a ceramic and glass based material, forming a seal frame and lid block from a ceramic and glass based material, creating a seal frame and lid by removing the ceramic and glass based material from the seal frame and lid block to a form plurality of sidewalls, a plurality of compartments, and at least one divider wall, placing the seal frame and lid on the mandrels such that one mandrel fits within each compartment, and cofiring the seal frame and lid.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figure 10:
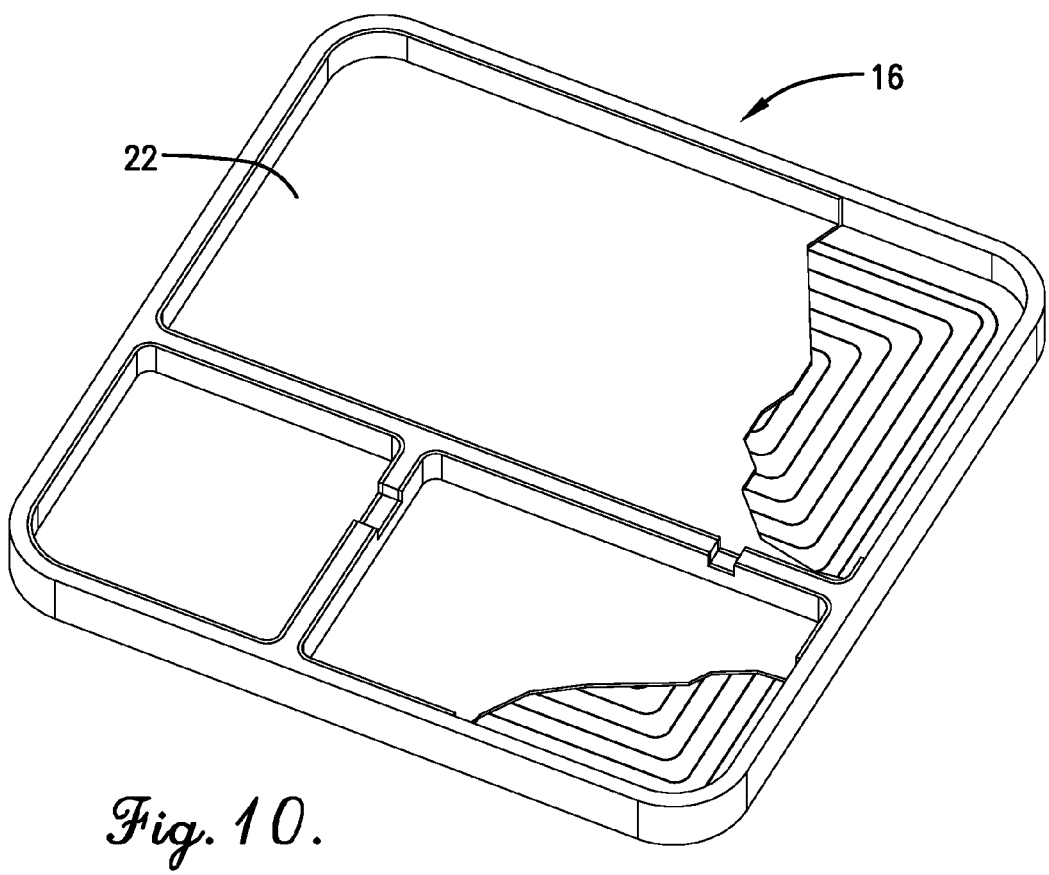
Figure 11:
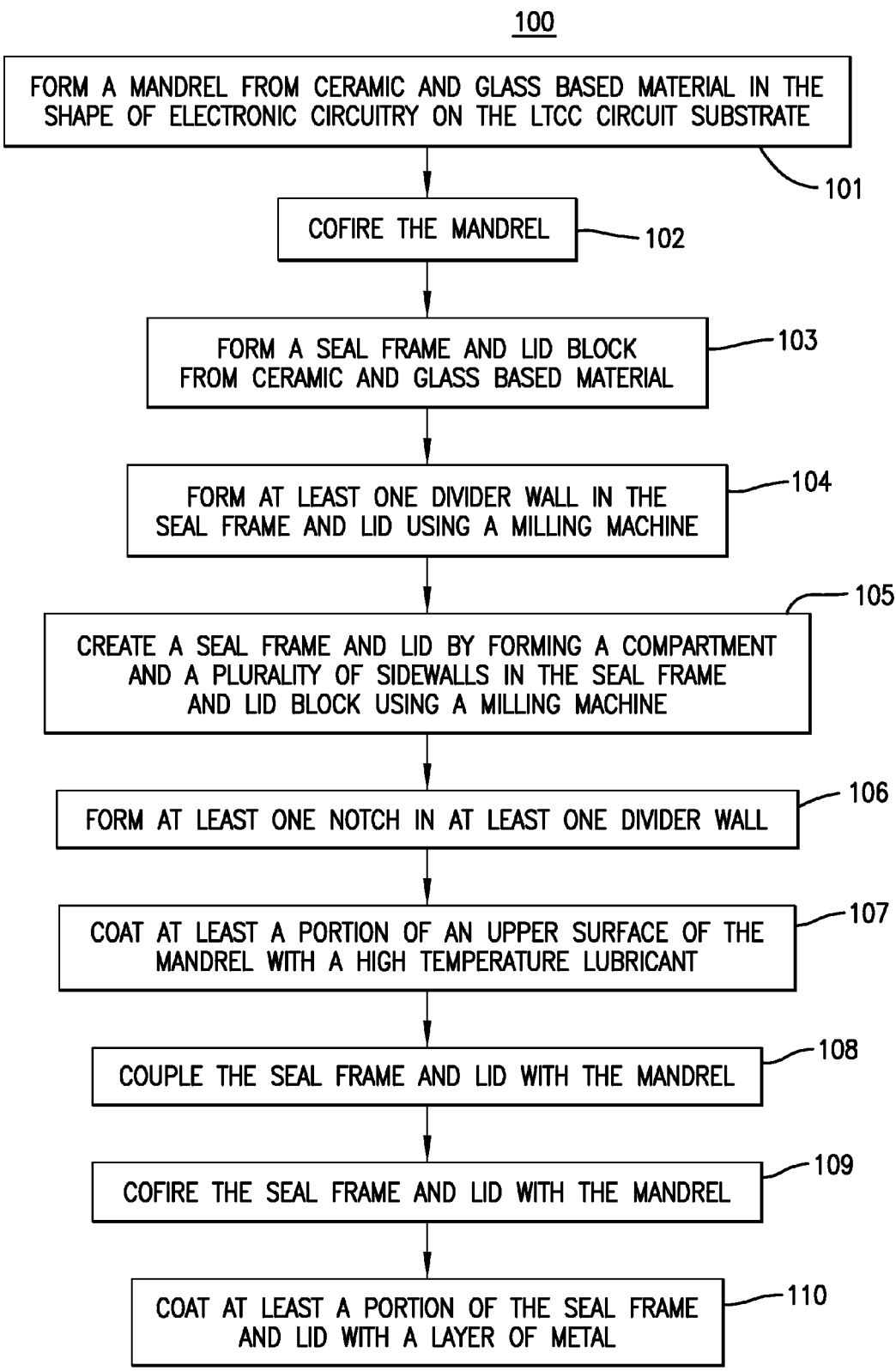

FIG. 10 is a perspective view of the seal frame and lid after the cofiring process and after the exterior of the seal frame and lid is coated with a layer of metal, wherein a portion of the metal is cut away to reveal the ceramic and glass material underneath; and FIG. 11 is a flow diagram of at least a portion of the steps of a method for forming a monolithic seal frame and lid for use with a substrate and electronic circuitry.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 1:
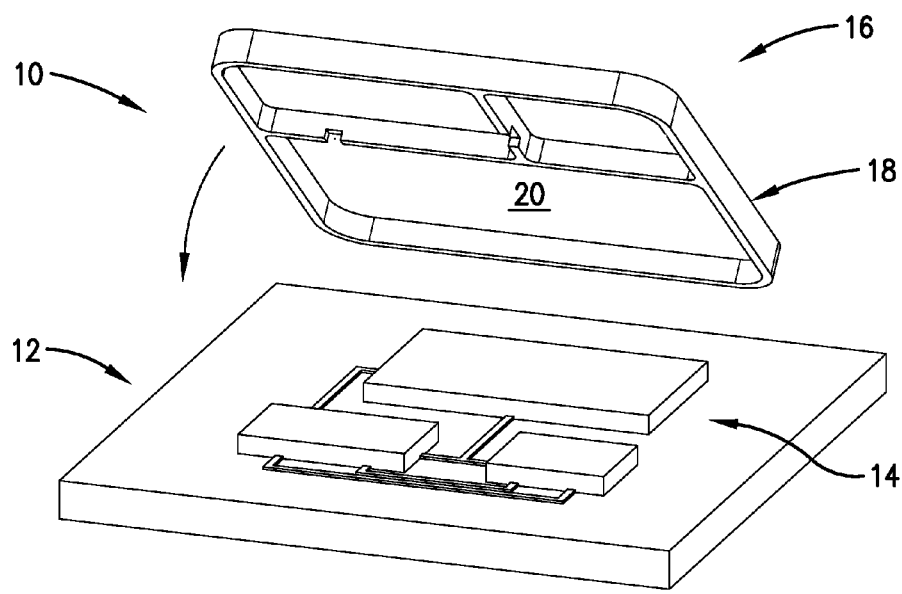
FIG. 1 is a perspective view of a microelectronic package comprising a low-temperature cofired ceramic (LTCC) circuit substrate, electronic circuitry, and a monolithic seal frame and lid, constructed in accordance with various embodiments of the current invention, wherein the seal frame and lid is removed from the LTCC substrate.
Figure 2:
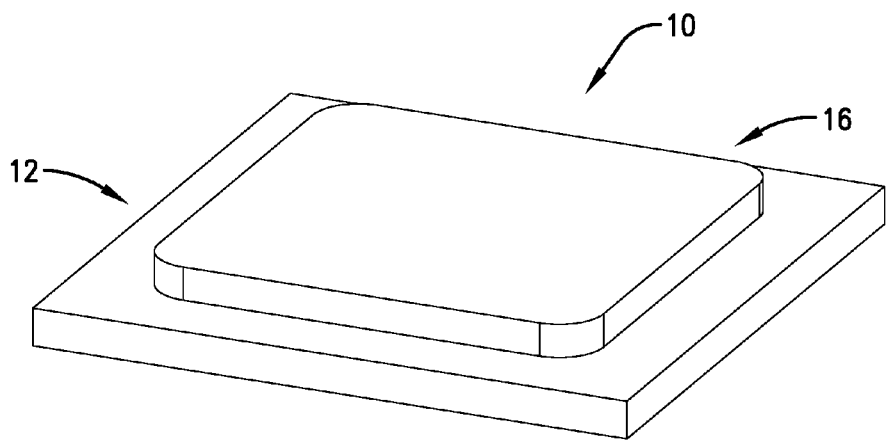
FIG. 2 is a perspective view of the microelectronic package of FIG. 1 with the seal frame and lid bonded to the LTCC substrate.

A microelectronic package 10 formed from a ceramic circuit substrate 12, electronic circuitry 14, and a monolithic seal frame and lid 16 and constructed in accordance with various embodiments of the current invention is shown in FIGS. 1 and 2. The electronic circuitry 14 may include analog, digital, or mixed-signal circuitry, radio frequency (RF) circuits—particularly high frequency transmitters and receivers, or other high performance circuits.

The ceramic circuit substrate 12, as seen in FIGS. 1 and 2, generally supports the electronic circuitry and may include integrated wiring and passive components. Typically, the ceramic circuit substrate 12 is formed from a plurality of layers of ceramic-based ($Al_2O_3$) material, particularly ceramic or ceramic and glass material. The ceramic circuit substrate 12 may include low-temperate cofired ceramic (LTCC) substrates or high-temperature cofired ceramic (HTCC) substrates. An exemplary ceramic material, also known as green sheets or tape, may include 951 P2, PT, or PX Green Tape from DuPont of Wilmington, Del., the CT products from Heraeus of Conshohocken, Pa., the A6 or L8 products from Ferro of Vista, Calif. Ceramic tape and powder products from other manufacturers may also be used to form the ceramic substrate 12. Each layer may include printed traces and other features or passive components, while between the layers there may be vias or interconnects. Often, an upper surface of the top layer may receive the electronic circuitry 14 in the form of one or more integrated circuits (ICs) chip which are wire bonded or flip-chip bonded to pads on the upper surface. Furthermore, although not shown in the figures, the ceramic substrate 12 may additionally or alternatively include electronic circuitry 14 that is positioned on a lower surface of a bottom layer. Thus, a first seal frame and lid 16 may be attached to the top layer of the ceramic substrate 12 while a second seal frame and lid 16 may be attached to the bottom layer.

The seal frame and lid 16, as seen in FIGS. 1, 2, and 7-10, includes a seal frame 18 and a lid 20 that have been formed as a single unit, typically from the same ceramic material that is used to form the ceramic circuit substrate 12. The seal frame and lid 16 may be bonded to the upper surface of the ceramic circuit substrate 12 in one of at least two ways. In a first embodiment, the seal frame and lid 16 may be epoxy bonded such that the seal frame 18 is attached to the ceramic substrate 12 using an epoxy or other adhesive or sealant. In a second embodiment, the seal frame and lid 16 may be solder bonded such that the seal frame 18 is soldered to the ceramic substrate 12 using known soldering techniques. To render the seal frame and lid 18 solderable, the seal frame and lid 16 may further include a metal coating 22 on the outer surface thereof, as seen in FIG. 10. The metal coating 22 may include titanium, copper, platinum, gold, or similar metals, or alloys thereof. Furthermore, the seal frame and lid 16 with the metal coating 22 on the outer surface may form a Faraday cage structure for purposes of electromagnetic interference (EMI) isolation of the electronic circuitry 14 which is covered by the seal frame and lid 16.

The seal frame 18 generally surrounds the electronic circuitry 14 that is on the upper surface of the top layer of the ceramic circuit substrate 12 and may be sealed or coupled to the upper surface. The seal frame 18 may include four sidewalls 24 connected to one another generally forming a rectangular or square shape. Other shapes are also possible, such as circular, oval, L-shape, and the like. Other embodiments may have at least one or more sidewalls 24 that form the other shapes. Furthermore, in some embodiments, the sidewalls 24 may have an interior surface with a draft angle which ranges from approximately 0° to approximately 45° from being normal to the lid 20. The sidewalls 24 may form a compartment 26 or chamber within the seal frame 18. The seal frame 18 may further include one or more divider walls 28 which may isolate or separate various electronic circuits from one another. The divider walls 28 may form multiple compartments 26 within the seal frame 18. The shape and size of each compartment 26 may correspond to the shape and size of the electronic circuit which it isolates. In some embodiments, the divider walls 28 may include one or more notches 30 along an edge of the divider wall 28 that contacts the upper surface of the top layer of the ceramic circuit substrate 12. The notches 30 may allow components, interconnects, or other features of the electronic circuitry 14 on the ceramic circuit substrate 12 to pass from one compartment 26 of the seal frame 18 to another compartment 26. The divider walls 28 may be positioned on the interior of the seal frame 18, within the sidewalls 24 and may intersect the sidewalls 24, although need not necessarily do so.

The lid 20 generally provides a cover for the electronic circuitry 14 that is on the upper surface of the top layer of the ceramic circuit substrate 12. The lid 20 may be coupled to the edges of the sidewalls 24 of the seal frame 18, and thus the perimeter of the lid 20 may have the same shape as the seal frame 18.

At least a portion of the steps of a method 100 for forming a monolithic seal frame and lid 16, in accordance with other embodiments of the current invention, is shown in FIG. 11. The steps of the method 100 may be performed in the order as shown in FIG. 11, or they may be performed in a different order. Furthermore, some steps may be performed concurrently as opposed to sequentially. In addition, some steps may not be performed.

Figure 9:
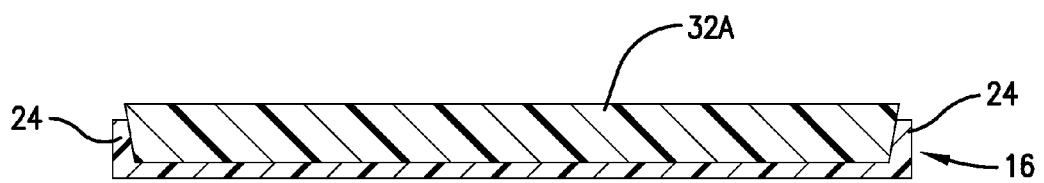
FIG. 9 is a cross sectional view along the line 9-9 from FIG. 8 of the seal frame and lid positioned on the mandrel.

Referring to step 101, a mandrel 32 may be formed from ceramic and glass based material. The mandrel 32, either before firing or after firing as discussed below, may serve as a mold in forming the seal frame and lid 16, primarily providing support to the lid 20 portion. Since the seal frame and lid 16 covers and protects the electronic circuitry 14 that is on the upper surface of the top layer of the ceramic circuit substrate 12, the seal frame and lid 16 must be formed to include one or more compartments 26, as discussed above, to accommodate the circuitry 14. Thus, there may be one or more mandrels 32—one mandrel 32 for each compartment 26. In the exemplary embodiment shown in the figures, there are three mandrels 32A, 32B, 32C. The mandrels 32A, 32B, 32C may have roughly the same footprint or shape as the electronic circuitry 14 and, in turn, the compartments 26 which they will help form. In some embodiments, the mandrels 32A, 32B, 32C may have roughly the same area (X, Y) dimensions as the electronic circuitry 14, while in other embodiments, the area of the mandrels 32A, 32B, 32C may be greater than that of the electronic circuitry 14. The mandrels 32A, 32B, 32C may have a height or thickness (Z) dimension that is greater than the height of the seal frame 18. The increased height of the mandrels 32A, 32B, 32C with respect to the seal frame 18 may enhance the ease of removal of the mandrels 32A, 32B, 32C from the seal frame 18 in subsequent steps. The mandrels 32A, 32B, 32C height may be greater by an amount that accounts for the reduction in size of the ceramic and glass based material during the cofiring process. Furthermore, in some embodiments, each mandrel 32 may have draft angle sidewalls 33, as seen in FIG. 9, whose angle varies from approximately 0° to approximately 45° from being normal to the upper and lower surfaces of the mandrel 32.

Figure 3:
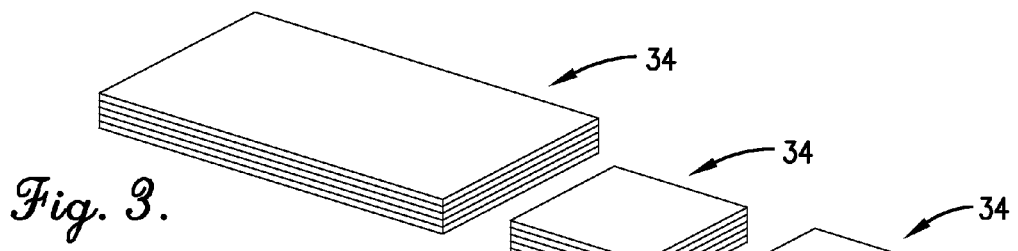
FIG. 3 is a perspective view of a plurality of sheets of ceramic and glass material used to form a plurality of mandrels.
Figure 4:
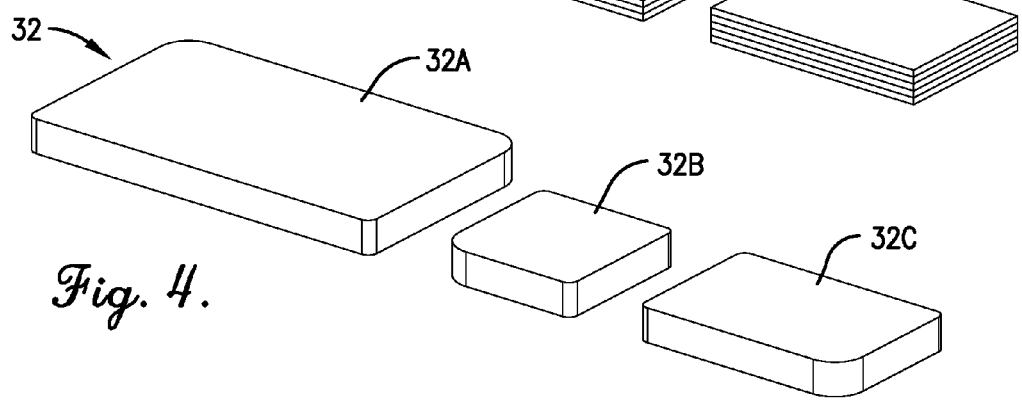
FIG. 4 is a perspective view of the mandrels formed from the sheets.

The mandrels 32A, 32B, 32C may be formed by stacking a plurality of sheets 34 (green sheets) of ceramic and glass based material one on another, as seen in FIG. 3, to achieve the correct thickness. The stack of sheets 34 may be cut or trimmed to the basic shape of the mandrels 32A, 32B, 32C, as seen in FIG. 4. Although the figures depict one set of mandrels 32A, 32B, 32C being formed from the sheets 34, multiple sets of mandrels 32, or multiple mandrels 32 for designs requiring only one mandrel 32, may be formed from a stack of sheets 34. Then, the trimmed stack of sheets 34 may be subjected to a heated lamination process as is generally known. The sheets 34 may be heated to a temperature of approximately 70 degrees Celsius at a certain pressure. The heating may activate binders within the ceramic and glass based material that make the sheets 34 adhere to one another such that the stack becomes relatively monolithic.

Referring to step 102, the mandrel 32 is cofired. The mandrel 32 may be cofired or heated using known firing techniques. In certain embodiments, a plurality of mandrels 32 may be cofired. This step is optional because, as discussed below, a prefired mandrel 32 or a cofired mandrel 32 may be used in later steps.

Figure 5:
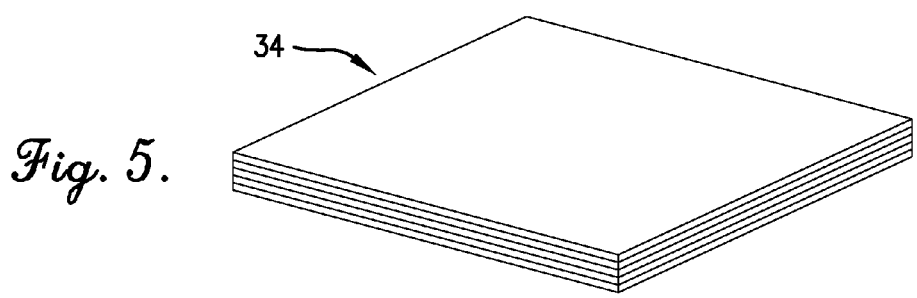
FIG. 5 is a perspective view of a plurality of sheets of ceramic and glass material used to form a seal frame and lid.
Figure 6:
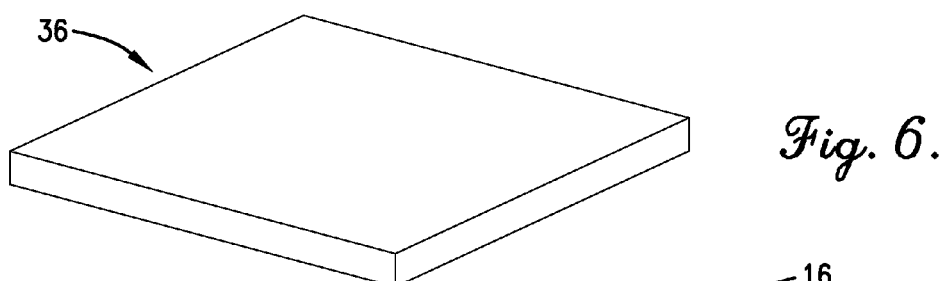
FIG. 6 is a perspective view of the ceramic and glass material used to form the seal frame and lid after a heated lamination process.

Referring to step 103, a seal frame and lid block 36 is formed from ceramic and glass based material. The size of the seal frame and lid block 36 may be based on the area and height of the circuitry 14 that needs to be covered on the upper surface of the top layer of the ceramic circuit substrate 12. The seal frame and lid block 36 may be formed by stacking a plurality of sheets 34 of ceramic and glass based material one on another, as seen in FIG. 5. In some embodiments, the stack of sheets 34 may be cut or trimmed to the basic shape of the seal frame and lid 16. The stack of sheets 34 may be subjected to the low temperature heating process mentioned above to create the seal frame and lid block 36, as seen in FIG. 6.

Figure 7:
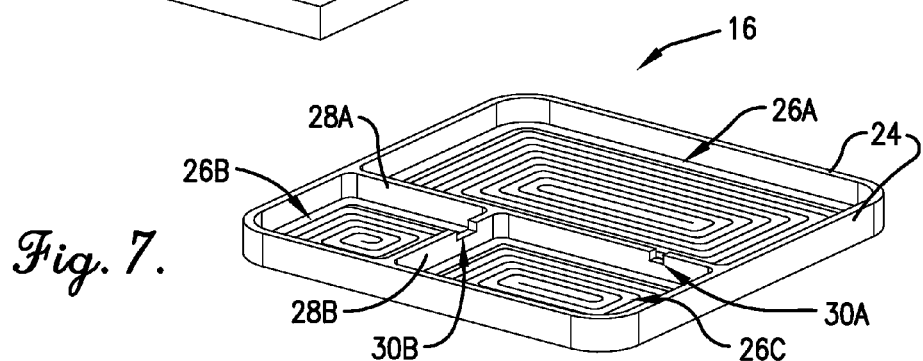
FIG. 7 is a perspective view of the seal frame and lid with a plurality of compartments that is formed by routing the ceramic and glass material of FIG. 6.
Figure 8:
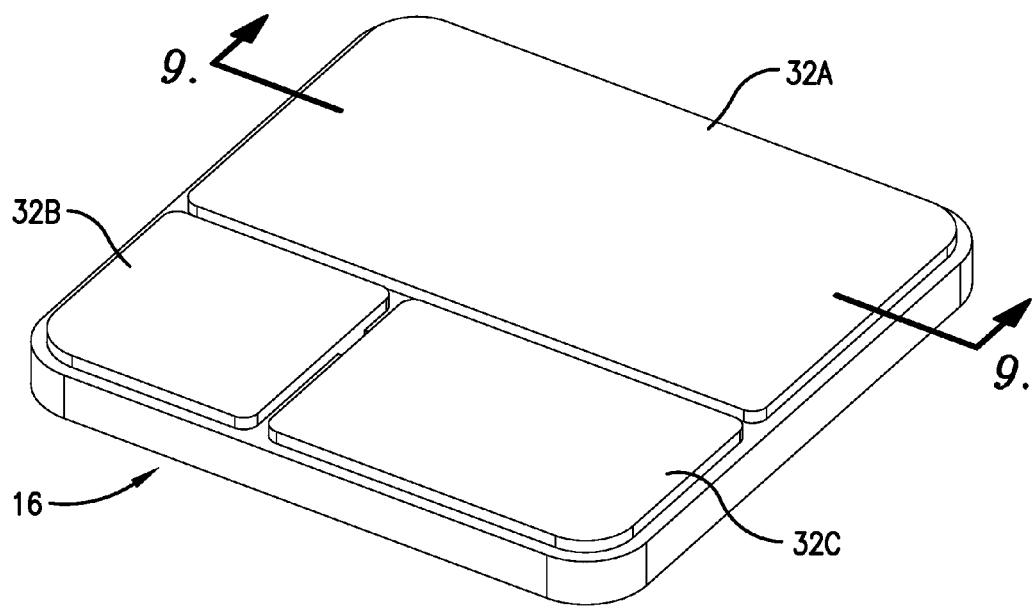
FIG. 8 is a perspective view of the seal frame and lid with a mandrel positioned each compartment before a cofiring process.

Referring to step 104, at least one divider wall 28 is formed in the seal frame and lid block 36, as seen in FIG. 7. The divider wall 28 may be formed by removing the appropriate ceramic and glass based material from the interior portion of the seal frame and lid block 36. The material is generally removed from a bottom surface of the seal frame and lid block 36, as a top surface of the seal frame and lid block 36 forms the lid 20. The material may be removed by drilling, milling, machining, routing, cutting, or otherwise modifying the seal frame and lid block 36. In some embodiments, the divider walls 28 may have surfaces with a draft angle which ranges from approximately 0° to approximately 45° from being normal to the lid 20. The forming of divider walls 28 may also form a plurality of compartments 26 within the seal frame and lid block 36. In the exemplary embodiment shown in the figures, there are two divider walls 28A, 28B, which form three compartments 26A, 26B, 26C. This step is optional, as divider walls 28 are not always required in the seal frame and lid 16.

Referring to step 105, a seal frame and lid 16 is created by forming at least one sidewall 24 in the seal frame and lid block 36, as seen in FIG. 7. If the seal frame and lid 16 has a circular or oval shape, then only one sidewall 24 needs to be formed. Otherwise, a plurality of sidewalls 24 are formed. The sidewalls 24, which define the seal frame 18, are generally formed by removing the appropriate ceramic and glass based material from the seal frame and lid block 36. The material may be removed by drilling, milling, machining, routing, cutting, or otherwise modifying the seal frame and lid block 36. In an exemplary embodiment, a high speed driller/router, such as the MX1-160 DH CCD from Schmoll Maschinen of Rodermark, Germany, is used to remove the ceramic and glass based material in order to form the sidewalls 24. In forming the sidewalls 24, a compartment 26 within the seal frame and lid 16 may be formed as well. In addition, in some embodiments, the interior surfaces of the sidewalls 24 may have a draft angle which ranges from approximately 0° to approximately 45° from being normal to the lid 20, as seen in FIG. 9.

Referring to step 106, at least one notch 30 is formed in at least one divider wall 28, as seen in FIG. 7. In the exemplary embodiment shown in the figures, there are two notches 30A, 30B. The notch 30 may be formed along an edge of the divider wall 28 that contacts the upper surface of the top layer of the ceramic circuit substrate 12. The notch 30 may be formed by drilling, milling, machining, routing, cutting, or otherwise modifying the divider wall 28. This step is optional, as notches 30 are not always required in the seal frame and lid 16.

Referring to step 107, at least a portion of an upper surface and sides of the mandrel 32 is coated with a high-temperature lubricant. The mandrel 32 may be prefired or cofired. The lubricant may ease the removal of the seal frame and lid 16 from the mandrel 32 that occurs in later steps of the method 100. An exemplary high-temperature lubricant is boron nitride, which may be used in temperatures ranging from 850° Celsius (C) to 1000° C. or higher.

Referring to step 108, the seal frame and lid 16 is coupled with the mandrel 32. If there is only one mandrel 32, then the seal frame and lid 16 may be placed on the mandrel 32. If there is a plurality of mandrels 32, then it may be advantageous to turn the seal frame and lid 16 over and place each mandrel 32 in its corresponding compartment 26. In the exemplary embodiment shown in FIG. 8, there are three mandrels 32A, 32B, 32C placed in three compartments 26A, 26B, 26C. In certain embodiments, the seal frame and lid 16, with the mandrels 32A, 32B, 32C in their compartments 26A, 26B, 26C, may be turned over again, such that the seal frame and lid 16 rests on top of the mandrels 32A, 32B, 32C, before the next step.

Referring to step 109, the seal frame and lid 16 and the mandrel 32 are cofired. The seal frame and lid 16 may be cofired or heated using known firing techniques.

Referring to step 110, at least a portion of the seal frame and lid 16 is coated or covered with a layer of metal to form a metal coating 22, as seen in FIG. 9, wherein a portion of the metal coating 22 is cut away to reveal the seal frame and lid 16 underneath. After removal from the mandrel 32, the seal frame 18 may be coated. In some embodiments, just the lower edges of the sidewalls 24 of the seal frame and lid 16 may be coated. An exemplary metal may include titanium, copper, platinum, gold, or similar metals, or alloys thereof. This step is optional, depending on the method of attachment of the seal frame and lid 16 to the ceramic circuit substrate 12. If the seal frame and lid 16 is solder bonded to the ceramic circuit substrate 12, then the step is performed. If the seal frame and lid 16 is epoxy bonded to the ceramic circuit substrate 12, then the step may or may not be performed depending on whether the electronic circuitry 14 requires EMI shielding.

After the seal frame and lid 16 is formed, in some embodiments, it may be solder bonded to the ceramic circuit substrate 12 in order to form the microelectronic package 10 of FIG. 2. In other embodiments, the seal frame and lid 16 is epoxy bonded to the ceramic circuit substrate 12.

In other embodiments of the current invention, the seal frame and lid 16 may be constructed using additive material manufacturing processes that generate the seal frame and lid 16 from ceramic stock material. As an example, a feed stock material comprising polymers and ceramic and glass powders may be heated and flowed through a nozzle. The heated composite material may then be deposited onto a work surface in a layerwise manner to build up the seal frame and lid 16 with component features such as the lid 20, the sidewalls 24, and the divider walls 28 without requiring support structures, such as mandrels 32, to remain after post processing.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A method for forming a monolithic seal frame and lid for use with a substrate and electronic circuitry, the method comprising the steps of:
    forming a mandrel from a ceramic and glass based material;
    forming a seal frame and lid block from a ceramic or ceramic and glass based material;
    creating a seal frame and lid by forming a compartment and at least one sidewall in the seal frame and lid block;
    placing the seal frame and lid on the mandrel such that the mandrel fits within the compartment; and
    cofiring the seal frame and lid.

2. The method of claim 1, wherein the mandrel is formed to have roughly the same footprint as the electronic circuitry and a greater height than the sidewalls of the seal frame and lid.

3. The method of claim 1, wherein the mandrel is formed by stacking a plurality of sheets of ceramic and glass based material one on another.

4. The method of claim 1, wherein the seal frame and lid block is formed by stacking a plurality of sheets of ceramic and glass based material one on another.

5. The method of claim 1, wherein the at least one sidewall is formed by removing ceramic and glass based material from the seal frame and lid block.

6. The method of claim 1, wherein the at least one sidewall is formed by routing the ceramic and glass based material of the seal frame and lid block.

7. The method of claim 1, wherein the at least one sidewall is formed to have an inner surface with a draft angle which ranges from approximately 0 degrees to approximately 45 degrees.

8. The method of claim 1, further comprising the step of coating at least a portion of the upper surface of the mandrel with a high-temperature lubricant before the seal frame and lid is placed thereon.

9. The method of claim 1, further comprising the step of coating at least a portion of the seal frame and lid with a layer of metal after the seal frame and lid has been cofired.

10. A method for forming a monolithic seal frame and lid for use with a substrate and electronic circuitry, the method comprising the steps of:
    forming a mandrel from a ceramic and glass based material, the mandrel having roughly the same footprint as the electronic circuitry with roughly the same length and width as the electronic circuitry;
    coating at least a portion of the upper surface of the mandrel with a high-temperature lubricant;
    forming a seal frame and lid block from a ceramic and glass based material;
    forming a seal frame and lid by routing ceramic and glass based material from the seal frame and lid block to create a compartment and at least one sidewall;
    placing the seal frame and lid on the mandrel such that the mandrel fits within the compartment;
    cofiring the seal frame and lid; and
    coating at least a portion of the seal frame and lid with a layer of metal.

11. The method of claim 10, wherein the mandrel is formed by stacking a plurality of sheets of ceramic and glass based material one on another.

12. The method of claim 10, wherein the seal frame and lid block is formed by stacking a plurality of sheets of ceramic and glass based material one on another.

13. The method of claim 10, further comprising the step of forming a plurality of divider walls between the at least one sidewall in the seal frame and lid block.

14. The method of claim 10, wherein the mandrel is formed to have a greater height than the sidewalls of the seal frame and lid.

15. The method of claim 10, wherein the at least one sidewall is formed to have an inner surface with a draft angle which ranges from approximately 0 degrees to approximately 45 degrees.

16. A method for forming a monolithic seal frame and lid for use with a substrate and electronic circuitry, the method comprising the steps of:
    forming a plurality of mandrels from a ceramic and glass based material;
    forming a seal frame and lid block from a ceramic and glass based material;
    creating a seal frame and lid by removing the ceramic and glass based material from the seal frame and lid block to form at least one sidewall, a plurality of compartments, and at least one divider wall;
    placing the seal frame and lid on the mandrels such that one mandrel fits within each compartment; and
    cofiring the seal frame and lid.

17. The method of claim 16, wherein each mandrel is formed to have roughly the same footprint as a portion of the electronic circuitry and a greater height than the sidewalls of the seal frame and lid.

18. The method of claim 16, further comprising the step of forming at least one notch along an edge of the at least one divider wall.

19. The method of claim 16, wherein the at least one sidewall, the compartments, and the divider walls are formed by routing the ceramic and glass material.

20. The method of claim 16, wherein the at least one sidewall is formed to have an inner surface with a draft angle which ranges from approximately 0 degrees to approximately 45 degrees.

\* \* \* \* \*